United States Patent
Chung et al.

(10) Patent No.: US 10,727,285 B2
(45) Date of Patent: Jul. 28, 2020

(54) NEAR-INFRARED LIGHT ORGANIC SENSORS, EMBEDDED ORGANIC LIGHT EMITTING DIODE PANELS, AND DISPLAY DEVICES INCLUDING THE SAME

(71) Applicant: Samsung Electronics Co., Ltd., Suwon-si, Gyeonggi-do (KR)

(72) Inventors: Chil Hee Chung, Seoul (KR); Sangyoon Lee, Seoul (KR); Yong Wan Jin, Seoul (KR); Kyung Bae Park, Hwaseong-si (KR); Kwang Hee Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/027,456

(22) Filed: Jul. 5, 2018

(65) Prior Publication Data
US 2019/0013368 A1 Jan. 10, 2019

(30) Foreign Application Priority Data

Jul. 4, 2017 (KR) .................. 10-2017-0084947

(51) Int. Cl.
*H01L 27/32* (2006.01)
*G06K 9/00* (2006.01)
(Continued)

(52) U.S. Cl.
CPC ........ *H01L 27/3234* (2013.01); *H01L 27/323* (2013.01); *H01L 27/3211* (2013.01);
(Continued)

(58) Field of Classification Search
CPC .............. H01L 27/3234; H01L 27/323; H01L 27/3211; H01L 27/307; H01L 2227/32;
(Continued)

(56) References Cited

U.S. PATENT DOCUMENTS

| | | |
|---|---|---|
| 7,768,007 B2 | 8/2010 | Yamazaki et al. |
| 9,389,715 B2 | 7/2016 | Yi et al. |
(Continued)

FOREIGN PATENT DOCUMENTS

| | | |
|---|---|---|
| CN | 101887691 B | 8/2012 |
| KR | 10-2015-0101509 A | 9/2015 |
(Continued)

OTHER PUBLICATIONS

European Office Action dated Nov. 20, 2018 for corresponding European Application No. 18181734.7.

*Primary Examiner* — Galina G Yushina
(74) *Attorney, Agent, or Firm* — Harness, Dickey & Pierce, P.L.C.

(57) ABSTRACT

An OLED panel may be embedded with a near-infrared organic photosensor and may be configured to implement biometric recognition without an effect on an aperture ratio of an OLED emitter. The OLED panel may include a substrate, an OLED stack on the substrate and configured to emit visible light, and an NIR light sensor stack between the substrate and the OLED stack and including an NIR emitter configured to emit NIR light and an NIR detector. The OLED panel may be included in one or more various electronic devices.

27 Claims, 12 Drawing Sheets

(51) Int. Cl.
*H01L 27/30* (2006.01)
*G06F 3/041* (2006.01)

(52) U.S. Cl.
CPC ........ *H01L 27/3213* (2013.01); *G06F 3/0416* (2013.01); *G06K 9/0004* (2013.01); *G06K 9/00228* (2013.01); *G06K 9/00604* (2013.01); *H01L 27/307* (2013.01)

(58) Field of Classification Search
CPC .................................................. H01L 31/09; G06K 9/00604; G06K 9/00228; G06K 9/0004; G06G 3/3208; G06F 3/0312
See application file for complete search history.

(56) References Cited

U.S. PATENT DOCUMENTS

| | | | |
|---|---|---|---|
| 9,589,170 B2 | 3/2017 | Ling | |
| 9,921,670 B2 | 3/2018 | Wang et al. | |
| 2001/0004900 A1* | 6/2001 | Ziegler | H01L 31/056 136/256 |
| 2002/0025490 A1* | 2/2002 | Shchegolikhin | B41M 3/14 430/270.15 |
| 2005/0200291 A1* | 9/2005 | Naugler, Jr. | G06F 3/0412 315/149 |
| 2005/0243023 A1* | 11/2005 | Reddy | G09G 3/2011 345/48 |
| 2006/0244693 A1 | 11/2006 | Yamaguchi et al. | |
| 2009/0315136 A1* | 12/2009 | Hayashi | H01L 27/14647 257/440 |
| 2011/0043487 A1* | 2/2011 | Huang | G06F 3/0412 345/175 |
| 2013/0194199 A1 | 8/2013 | Lynch et al. | |
| 2015/0155065 A1* | 6/2015 | Park | H01B 1/02 428/332 |
| 2015/0293661 A1 | 10/2015 | Gomez | |
| 2015/0331508 A1 | 11/2015 | Nho et al. | |
| 2015/0364527 A1 | 12/2015 | Wang et al. | |
| 2016/0179274 A1* | 6/2016 | Heo | G06F 3/044 345/173 |
| 2017/0055146 A1 | 2/2017 | Ko | |
| 2017/0278909 A1* | 9/2017 | Jeon | A61B 5/1171 |

FOREIGN PATENT DOCUMENTS

| | | |
|---|---|---|
| KR | 10-2016-0106416 A | 9/2016 |
| KR | 10-2017-0037436 A | 4/2017 |
| KR | 10-1726597 B1 | 4/2017 |
| KR | 10-2017-0053893 A | 5/2017 |
| WO | WO-2017-048478 A1 | 3/2017 |

\* cited by examiner

NEAR-INFRARED LIGHT ORGANIC SENSORS, EMBEDDED ORGANIC LIGHT EMITTING DIODE PANELS, AND DISPLAY DEVICES INCLUDING THE SAME

CROSS-REFERENCE TO RELATED APPLICATION

This application claims priority to and the benefit, under 35 U.S.C. § 119, of Korean Patent Application No. 10-2017-0084947 filed in the Korean Intellectual Property Office on Jul. 4, 2017, the entire contents of which are incorporated herein by reference.

BACKGROUND

1. Field

Organic light emitting diode (OLED) panels and display devices including the same are disclosed. More particularly, the present disclosure relates to organic light emitting diode (OLED) panels embedded with near-infrared organic photosensors configured to implement biometric recognition, and mobile devices including the same.

2. Description of the Related Art

Organic light emitting diode (OLED) display devices have merits of excellent luminance, driving voltage, and response speed characteristics and implementing color images, so they are being employed for (e.g., are included in) various display devices.

Meanwhile, recently, display devices have increasingly implemented biometric technologies via which certain biometric information or gesture information is extracted by an automatic device to authenticate a person in financial, health care, and mobile fields. Particularly, leading smartphone companies are focusing on adapting fingerprint and iris recognition technologies.

Since Apple took over AuthenTech, which was a manufacturer of semiconductive sensors for finger scans, they (Apple) have been consistently mounting fingerprint sensors in iPhones® and iPads®. US 2015-0331508 also discloses technology of forming a near-infrared sensor for fingerprint recognition on the same plane as an OLED emitter. However, since a near-infrared emitter and a near-infrared detector for fingerprint recognition are formed on the same plane as the OLED emitter in US 2015-0331508, an aperture ratio of the OLED emitter relative to a conventional OLED emitter having no fingerprint sensor is decreased. The aperture ratio decrease of the OLED emitter may have a large influence on display characteristics of a mobile display device, particularly, a smart phone having a small display area.

SUMMARY

Some example embodiments provide an OLED panel embedded with a near-infrared organic photosensor configured to implement biometric recognition without an effect on an aperture ratio of an OLED emitter.

Some example embodiments provides a display device including an OLED panel embedded with a near-infrared organic photosensor for implementing biometric recognition without an effect on an aperture ratio of an OLED emitter.

According to some example embodiments, an OLED panel embedded with a near-infrared organic photosensor includes plurality of OLED pixels, the plurality of OLED pixels including a substrate, an OLED stack disposed on the substrate and emitting visible light, and an NIR light sensor stack disposed between the substrate and the OLED stack and including an NIR emitter emitting NIR light and an NIR detector.

The OLED panel according to some example embodiments may maintain 100% of an opening part of the OLED emitter by forming the near-infrared organic photosensor and the OLED emitter as a stack structure and thus display characteristics.

In addition, the near-infrared organic photosensor beneath the OLED emitter may effectively perform biometrics by using a near infrared ray.

Furthermore, the near-infrared organic photosensor is formed of an organic material and thus may be bent or elastic. Accordingly, the near-infrared organic photosensor may contribute to easily realizing a flexible display device and thus improve portability and versatility of a display device.

According to some example embodiments, an Organic Light Emitting Diode (OLED) panel embedded with a Near Infrared (NIR) light sensor may include a substrate, an OLED stack on the substrate, the OLED stack configured to emit visible light, and an NIR light sensor stack between the substrate and the OLED stack. The NIR light sensor stack may include an NIR emitter configured to emit NIR light and an NIR detector, such that the NIR light sensor includes the NIR emitter and the NIR detector.

At least one element of the NIR emitter and the NIR detector may be in a given OLED pixel of the plurality of OLED pixels.

Both the NIR emitter and the NIR detector may be in one or more sub-pixels of an OLED pixel, while neither of any NIR emitter or any NIR detector may be in one or more other sub-pixels of the OLED pixel.

The NIR emitter and the NIR detector may be on a non-light-emitting portion of an OLED pixel, the non-light emitting portion between at least two proximate sub-pixels of the OLED pixel.

The OLED stack may be configured to emit light away from the NIR light sensor stack.

The OLED emitter of the OLED stack may be an organic light emitting diode (OLED) including an organic emission layer and a plurality of electrodes on opposite surfaces of the organic emission layer, such that a first electrode of the plurality of electrodes is under the organic emission layer and a second electrode of the plurality of electrodes is over the organic emission layer. The second electrode may include a transparent electrode.

Both of the NIR emitter and the NIR detector may be in one or more sub-pixels of an OLED pixel, while neither of any NIR emitter or any NIR detector may be in one or more other sub-pixels of the OLED pixel, and the first electrode may include a separate transparent electrode.

The NIR emitter and the NIR detector may be on the non-light-emitting portion between proximate sub-pixels of an OLED pixel, and the first electrode may include a reflective electrode.

The OLED panel may further include a driver between the substrate and the NIR light sensor stack, the driver configured to input and output electrical signals of each of the NIR light sensor stack and the OLED stack.

A driver configured to input and output an electrical signal from the NIR light sensor stack and a driver configured to input and output an electrical signal from the OLED stack may be on a substantially common plane.

The NIR emitter may be an NIR organic photodiode that is configured to emit NIR light of a wavelength spectrum of about 800 nm to about 1500 nm.

The NIR organic photodiode includes an organic emission layer configured to emit the NIR light and lower and upper electrodes on opposite surfaces of the organic emission layer, respectively, and the upper electrode may be a transparent electrode and the lower electrode is a reflective electrode.

The NIR detector may be an NIR organic photodiode that is configured to absorb NIR light of a wavelength spectrum of about 800 nm to about 1500 nm.

The NIR organic photodiode may include an organic light-absorbing layer configured to absorb the NIR light and lower and upper electrodes on opposite surfaces of the organic light-absorbing layer, respectively. The upper electrode may be a transparent electrode having a transmittance equal to or greater than about 80%, and the lower electrode is a reflective electrode.

The NIR light sensor stack may be configured to detect a fingerprint, an iris, or face image.

A display device may include the OLED panel embedded with the NIR light sensor.

According to some example embodiments, an Organic Light Emitting Diode (OLED) panel may include a plurality of OLED pixels, where the plurality of OLED pixels includes a substrate, an OLED stack on the substrate, the OLED stack configured to emit visible light, and an NIR light sensor stack between the substrate and the OLED stack, the NIR light sensor stack including an NIR emitter configured to emit NIR light, and an NIR detector.

The NIR light sensor stack may be between the substrate and the OLED stack

The OLED stack may be between the substrate and the NIR light sensor stack.

At least one element of the NIR emitter and the NIR detector may be in a given OLED pixel of the plurality of OLED pixels.

The OLED panel may further include a driver on the NIR light sensor stack such that the driver is between the substrate and the NIR light sensor stack, the driver configured to input and output electrical signals of each of the NIR light sensor stack and the OLED stack.

A driver configured to input and output an electrical signal from the NIR light sensor stack and a driver configured to input and output an electrical signal from the OLED stack may be on a substantially common plane.

The NIR emitter may be an NIR organic photodiode that is configured to emit NIR light of a wavelength spectrum of about 800 nm to about 1500 nm.

The NIR organic photodiode may include an organic emission layer configured to emit the NIR light and lower and upper electrodes on opposite surfaces of the organic emission layer, respectively, and the upper electrode may be a transparent electrode and the lower electrode is a reflective electrode.

The NIR detector may be an NIR organic photodiode that is configured to absorb NIR light of a wavelength spectrum of about 800 nm to about 1500 nm.

The NIR organic photodiode may include an organic light-absorbing layer configured to absorb the NIR light and lower and upper electrodes on opposite surfaces of the organic light-absorbing layer, respectively. The upper electrode may be a transparent electrode having a transmittance equal to or greater than about 80%, and the lower electrode is a reflective electrode.

According to some example embodiments, an electronic device may include a memory, a processor, and a display device including an Organic Light Emitting Diode (OLED) panel. The OLED panel may include a substrate, an OLED stack on the substrate, the OLED stack configured to emit visible light, and an NIR light sensor stack between the substrate and the OLED stack, the NIR light sensor stack including an NIR emitter configured to emit NIR light and an NIR detector, such that the NIR light sensor includes the NIR emitter and the NIR detector.

The processor may be configured to execute a program of instructions stored in the memory to implement biometric recognition of an individual based on processing electrical signals received from the NIR light sensor to detect a fingerprint, an iris, or face image.

The OLED panel may further include a driver between the substrate and the NIR light sensor stack, the driver configured to input and output electrical signals of each of the NIR light sensor stack and the OLED stack.

A driver configured to input and output an electrical signal from the NIR light sensor stack and a driver configured to input and output an electrical signal from the OLED stack may be on a substantially common plane.

The NIR emitter may be an NIR organic photodiode that is configured to emit NIR light of a wavelength spectrum of about 800 nm to about 1500 nm.

The NIR organic photodiode may include an organic emission layer configured to emit the NIR light and lower and upper electrodes on opposite surfaces of the organic emission layer, respectively, and the upper electrode may be a transparent electrode and the lower electrode is a reflective electrode.

The NIR detector may be an NIR organic photodiode that is configured to absorb NIR light of a wavelength spectrum of about 800 nm to about 1500 nm.

The NIR organic photodiode may include an organic light-absorbing layer configured to absorb the NIR light and lower and upper electrodes on opposite surfaces of the organic light-absorbing layer, respectively, wherein the upper electrode is a transparent electrode having a transmittance equal to or greater than about 80%, and the lower electrode is a reflective electrode.

DETAILED DESCRIPTION

Figure 1A:
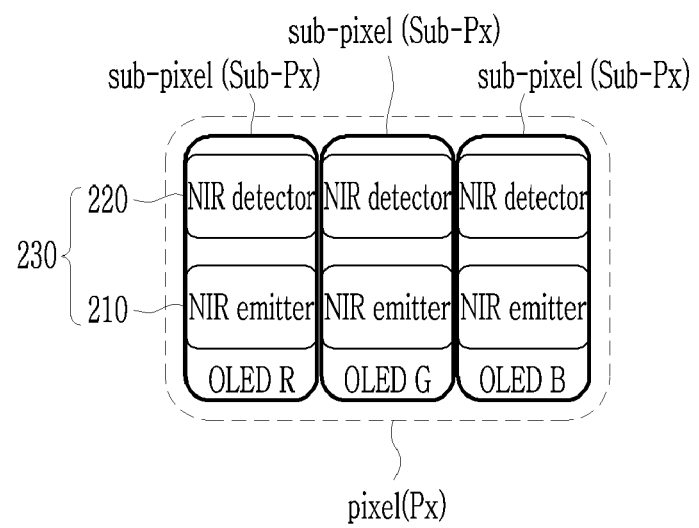
FIGS. 1A and 1B are schematic views showing a pixel layout of an organic light emitting diode (OLED) panel embedded with a near infrared (NIR) organic photosensor according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting diode (OLED) panel embedded with a near-infrared organic photosensor according to some example embodiments is described with references to drawings.

Figure 1B:
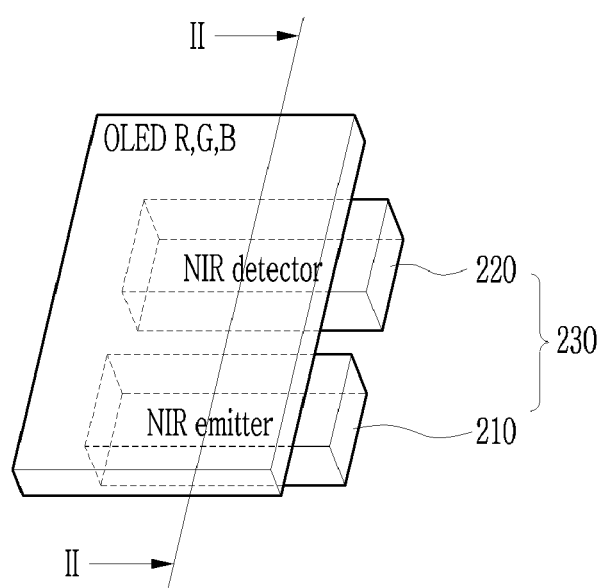
Figure 2:
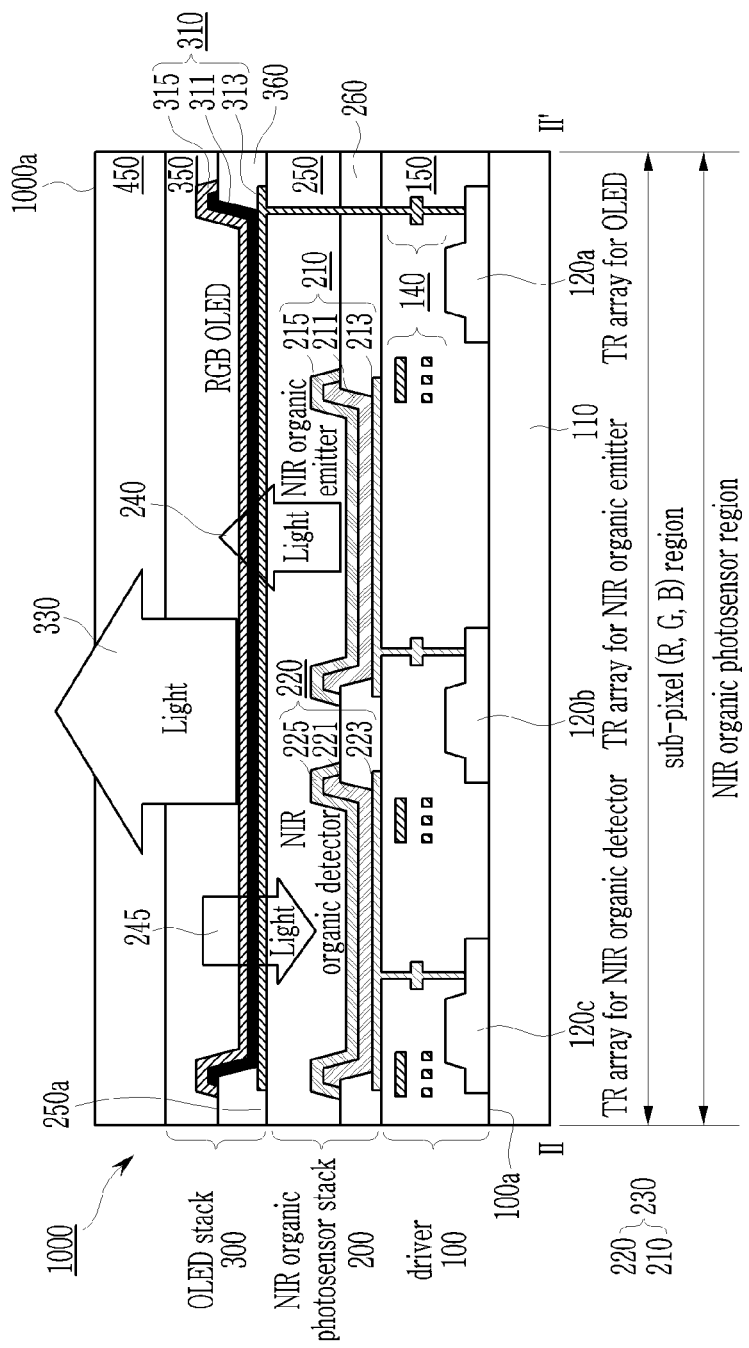
FIG. 2 is a cross-sectional view showing an OLED panel embedded with an NIR organic photosensor according to some example embodiments.

FIGS. 1A-1B and FIG. 2 show a pixel layout of an OLED panel 1000 embedded with a near-infrared organic photosensor 230 according to some example embodiments and a cross-sectional view thereof, respectively.

Referring to FIGS. 1A-1B and FIG. 2, an OLED panel 1000 embedded with a near-infrared organic photosensor 230 according to some example embodiments is a stack-type panel including a near infrared (NIR) organic photosensor stack 200 stacked under an OLED stack 300. As shown in at least FIG. 2, the OLED panel 1000 may include a substrate 110, an OLED stack 300 on the substrate, and an NIR organic photosensor stack 200 on the substrate 110, where the NIR organic photosensor stack 200 ("NIR light sensor stack"), as shown in FIG. 2, may be between the substrate 110 and the OLED stack 300.

In the OLED panel 1000 embedded with a near-infrared organic photosensor 230, sub-pixels emitting different lights (R, G, B) having different wavelengths from each other are gathered to provide a unit pixel (Px), and the unit pixel (Px) is repeatedly arranged with a matrix to complete the OLED panel 1000.

As described herein, the near-infrared (NIR) organic photosensor 230 is "embedded" in the OLED panel 1000 based on being included within the outer volume boundaries defined by the OLED panel 1000. Accordingly, the photosensor 230 may configure the OLED panel 1000 to implement biometric recognition of a subject without having effect on an aperture ratio of the OLED emitter 310. For example, as shown in at least FIG. 2, the NIR organic photosensor 230 is located within the outer volume boundaries defined by, at a first side, at least one of OLED stack 300 and the cover glass 450 and, at a second side, at least one of driver 100 and substrate 110. Thus, the NIR organic photosensor 230 may be understood to be, based on being "embedded" in the OLED panel 1000, located within an interior of the OLED panel 1000 as defined by the outer volume boundaries of at least some elements of the OLED panel 1000 that are configured to enable emission of light from the OLED stack 300.

While FIGS. 1A-1B and FIG. 2 illustrate the NIR photosensing stack 200 as being distal from front surface 1000a in relation to the OLED stack 300, it will be understood that, in some example embodiments, the NIR photosensing stack may be proximate to front surface 1000a in relation to the OLED stack 300, such that the NIR organic photosensor stack 200 is between the cover glass 450 and the OLED stack 300.

FIGS. 1A-1B exemplify a plane view (FIG. 1A) and a perspective view (FIG. 1B) in which an NIR organic photosensor 230 is disposed in each OLED sub-pixel (Sub-Px). The NIR organic photosensor 230 may include an NIR organic emitter 210 and an NIR detector 220 for improving ("configured to improve") biometric recognition efficiency. As shown in at least FIG. 1A, at least one element of the NIR organic emitter 210 and NIR organic detector 220 may be in a given pixel (Px) of the OLED panel 1000.

Accordingly, as shown in FIG. 2 that is a cross-sectional view taken along a line II-II' of FIG. 1B, a sub-pixel region and an NIR organic photosensor region are overlapped.

As referred to herein, an element that is "on" another element may be "above" or "under" the other element. Conversely, an element that is described as being "above" or "under" another element will be understood to be "on" the other element. Additionally, an element that is "on" another element may be "directly on" (e.g., in contact with) the other element or may be "indirectly on" (e.g. isolated from direct contact with via an interposing element(s) and/or a gap space) the other element.

The OLED stack 300 is a region of a device that is configured to display an image. Accordingly, the OLED stack 300 may be configured to emit visible light (e.g., light in a visible wavelength spectrum). The visible wavelength spectrum may include light in a range of about 380 nanometers to about 800 nanometers. When the terms "about" or "substantially" are used in this specification in connection with a numerical value, it is intended that the associated numerical value include a tolerance of ±10% around the stated numerical value. When ranges are specified, the range includes all values therebetween such as increments of 0.1%. The OLED stack 300 includes an organic light emitting diode (OLED) emitter 310 including an organic emission layer 311, and a first electrode 313 and a second electrode 315 formed under and over the organic emission layer 311, respectively, such that the first and second electrodes 313 and 315 are, respectively, on opposite surfaces of the organic emission layer 311. As shown in FIG. 2, the OLED emitter 310 may be at least partially on each of a lower insulation layer 360 and an upper insulation layer 350 of the OLED stack 300, and may further be at least partially between the lower insulation layer 360 and the upper insulation layer 350. The organic emission layer 311 may be formed of ("may at least partially comprise") various organic materials inherently configured to emit light 330 of any one color of red R, green G, and blue B colors toward a front surface 1000a of the OLED panel 1000, that is in an opposite direction of (e.g., away from) the NIR organic photosensor stack 200, as shown in at least FIG. 2. Either one electrode of the first electrode 313 and the second electrode 315 is connected (e.g., electrically coupled) with a driving voltage line (Vdd) and an output terminal (Out Put) to be configured to function as an anode, and the other one electrode is connected (e.g., electrically coupled) with a common voltage (Vss) to be configured to function as a cathode. The second electrode 315 may be formed as ("may at least partially comprise") a transparent electrode having a thickness of 10 nm or less in order to be configured to display light emitted from the organic emission layer 311 outside (e.g., towards front surface 1000a to an external environment that is external to the OLED panel 1000). For example, the second electrode 315 may be formed of MgAg, Ag, Al, Mo, Ti, TiN, Ni, ITO, IZO, AIZO, AITO, or the like. The first electrode 313 may be formed of ("may at least partially comprise") a transparent electrode (e.g., a separate transparent electrode in relation to a transparent electrode of the second electrode 315) in order to be configured to enable NIR light to exit from and enter to the NIR organic photosensor stack 200 (e.g., via surface 250a). In some example embodiments, the transparent electrode is formed with ("at least partially comprises") a transparent material having transmittance of 80% or more. For example, the first electrode 313 may be formed of ("may at least partially comprise") ITO, IZO, AIZO, AITO, or the like. The NIR organic photosensor stack 200 ("NIR light sensor stack") may include an NIR organic emitter 210 and an NIR organic detector 220. The NIR organic emitter 210 and the NIR organic detector 220 may collectively comprise the NIR organic photosensor 230 ("NIR light sensor"). As shown in FIG. 2, the NIR organic photosensor 230 may be at least partially on each of a lower insulation layer 260 and an upper insulation layer 250 of the NIR organic photosensor stack 200, and may further be at least partially between the lower insulation layer 260 and the upper insulation layer 250.

The NIR organic emitter 210 may be an NIR organic photodiode including an organic emission layer 211 that is configured to emit light in an NIR wavelength spectrum (e.g., one or more NIR wavelengths in a wavelength spectrum ranging from about 800 nm to about 1500 nm) and a first electrode 213 and a second electrode 215 formed under and over the organic emission layer 211, respectively (e.g., on opposite surfaces of the organic emission layer 211, as shown in at least FIG. 2). The organic emission layer 211 may be formed of ("may at least partially comprise") one material of the following materials represented by Chemical Formula 1 or a mixture thereof, which are appropriate for emitting NIR light of a wavelength region ranging from about 800 nm to about 1500 nm, but the present disclosure is not limited thereto but may include any material appropriate for emitting light in a desired NIR wavelength.

[Chemical Formula 1]

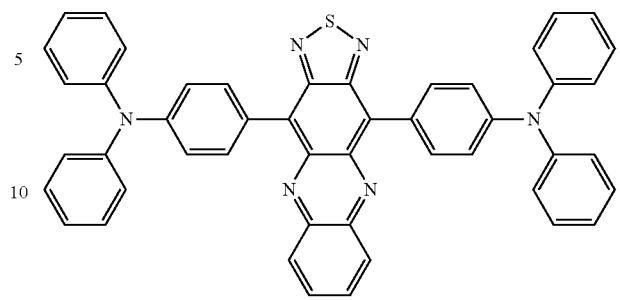

4,4'-([1,2,5]thiadiazolo[3,4-b]phenazine-4,11-diyl)bis(N,N-diphenylaniline)

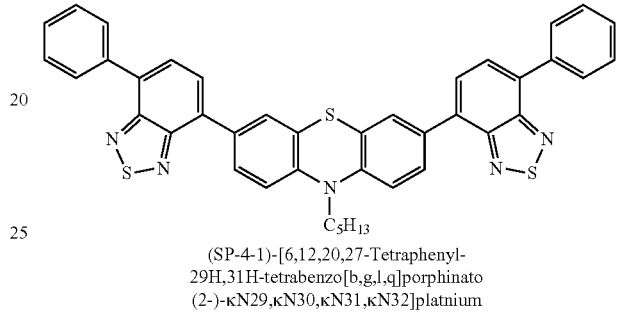

(SP-4-1)-[6,12,20,27-Tetraphenyl-29H,31H-tetrabenzo[b,g,l,q]porphinato(2-)-κN29,κN30,κN31,κN32]platnium

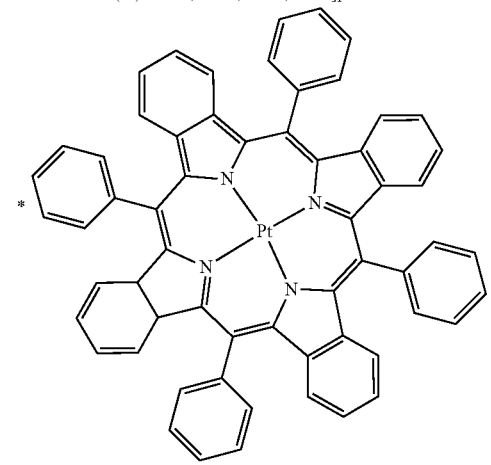

10-hexyl-3,7-bis(7-phenylbenzo[c][1,2,5]thiadiazol-4-yl)-10H-phenothiazine

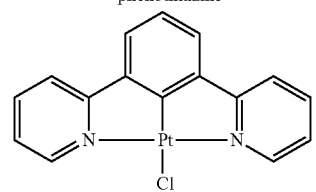

(1.3-Bis(2-pyridinyl)phenyl-C,N,N')(chloro)platinum

At least one electrode of the first electrode 213 ("lower electrode") and the second electrode 215 ("upper electrode") is connected (e.g., electrically coupled) with a driving voltage line (Vdd) and an output terminal (Out Put) and is configured to function as an anode, and the other electrode is connected (e.g., electrically coupled) with a common voltage (Vss) and is configured to function as a cathode. The second electrode 215 may be formed as ("may at least partially comprise") a transparent electrode in order to be configured to enable NIR light emitted from the NIR organic emitter 210 to exit the NIR organic photosensor stack 200 (e.g., the surface 250*a*). For example, the second electrode 215 may be formed of ("may at least partially comprise) ITO, IZO, ALZO, ALTO, or the like. The first electrode 213 may be formed as ("may at least partially comprise") a reflective electrode configured to enable the emitted light to be emitted toward the second electrode 215 through resonance, and the second electrode 215 may be a transparent electrode. For example, the second electrode 215 may be formed of ("may at least partially comprise") Al, Ag. Mo, AlNd, Mo/Al/Mo, TiN, ITO/Ag/ITO, ITO/Al/ITO, ITO/Mo/ITO, or the like.

The NIR organic detector 220 may be an NIR organic photodiode including an organic light-absorbing layer 221 that is configured to absorb light in an NIR wavelength and a first electrode 223 and a second electrode 225 formed under and over the organic light-absorbing layer 221, respectively (e.g., on opposite surfaces of the organic light-absorbing layer 221, as shown in at least FIG. 2). The organic light-absorbing layer 221 may be formed of ("may at least partially comprise") a material appropriate for absorbing ("configured to absorb") light of a NIR wavelength. In other words, the organic light-absorbing layer 221 may be formed of ("may at least partially comprise") an appropriate material for absorbing ("configured to absorb") light in a wavelength region ("wavelength spectrum") of about 800 to about 1500 nm. For example, the organic light-absorbing layer 221 may be formed of ("may at least partially comprise") one material of the following materials represented by Chemical Formula 2 or a mixture thereof, but the present disclosure is not limited thereto but may include any appropriate material for absorbing light of an NIR wavelength.

[Chemical Formula 2]

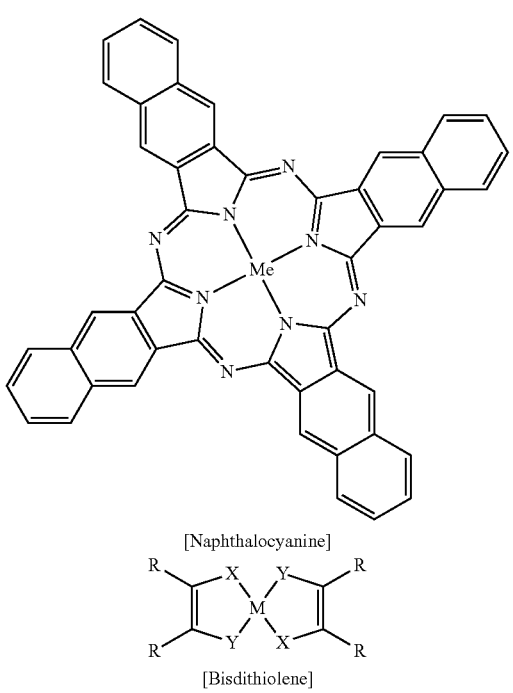

[Naphthalocyanine]

[Bisdithiolene]

-continued

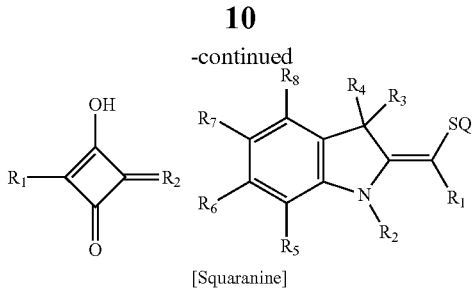

[Squaranine]

The second electrode 225 of the NIR organic detector 220 may at least partially comprise a transparent electrode in order to be configured to absorb NIR at most. In some example embodiments, the second electrode 225 may be formed of ("may at least partially comprise") a transparent electrode having transmittance of about 80% or greater (e.g., equal to or greater than about 80%). For example, the second electrode 225 may be formed of ("may at least partially comprise") ITO, IZO, AITO, carbon nanotube (CNT), graphene, nanosilver (Nano Ag), or the like. The first electrode 223 may be formed as ("may at least partially comprise") a reflective electrode so that the incident light is not transmitted and lost. For example, the first electrode 223 may be formed of ("may at least partially comprise") Al, Ag, Mo, AlNd, Mo/Al/Mo, TiN, ITO/Ag/ITO, ITO/Al/ITO, ITO/Mo/ITO or the like.

A driver 100 may be disposed between the substrate 110 and the NIR organic photosensor stack 200 so as to be configured to not inhibit light emitting and light-receiving functions of the OLED stack 300 and the NIR organic photosensor stack 200.

The driver 100 includes various transistor arrays 120*a*, 120*b*, and 120*c* formed on the substrate 110 that are configured to input and output electrical signals of each of the NIR organic photosensor stack 200 and the OLED stack 300, and an interlayer insulating layer 150 in which a multi-layered wire layer 140 is formed.

The OLED transistor array 120*a*, the transistor array 120*b* for the NIR organic emitter, and the transistor array 120*c* for the NIR organic detector (each of which may be referred to herein as a separate "driver") may be formed on the same plane (e.g., a common plane, as shown in at least FIG. 2). The OLED transistor array 120*a*, the transistor array 120*b* for the NIR organic emitter, and the transistor array 120*c* for the NIR organic detector may be formed on a substantially common ("same") plane (e.g., the same plane within manufacturing tolerances and/or material tolerances). When they are formed on the same or substantially same plane, each process of forming the transistor arrays 120*a*, 120*b*, and 120*c* may be simultaneously carried out so it is not needed to produce an additional process mask, compared to the case of forming the transistor arrays 120*a*, 120*b*, and 120*c* on different planes, so the number of process steps may be reduced, thereby improving efficiency of fabrication of the OLED panel 1000. In addition, the thickness of the panel including the OLED panel 1000 may be formed to be thinner than the case an OLED panel 1000 that includes transistor arrays 120*a*, 120*b*, and 120*c* in different planes, so it may favorably accomplish a flexible panel.

The substrate 110 may be formed with ("may include") various materials such as glass or plastic. In a case of plastic, it may be formed with ("may include") a transparent and flexible material.

A cover glass 450 is attached on an upper surface of the OLED stack 300 by an adhesive (not shown) to be configured to protect the structure below and to form a display surface and a biometric surface.

Figure 3:
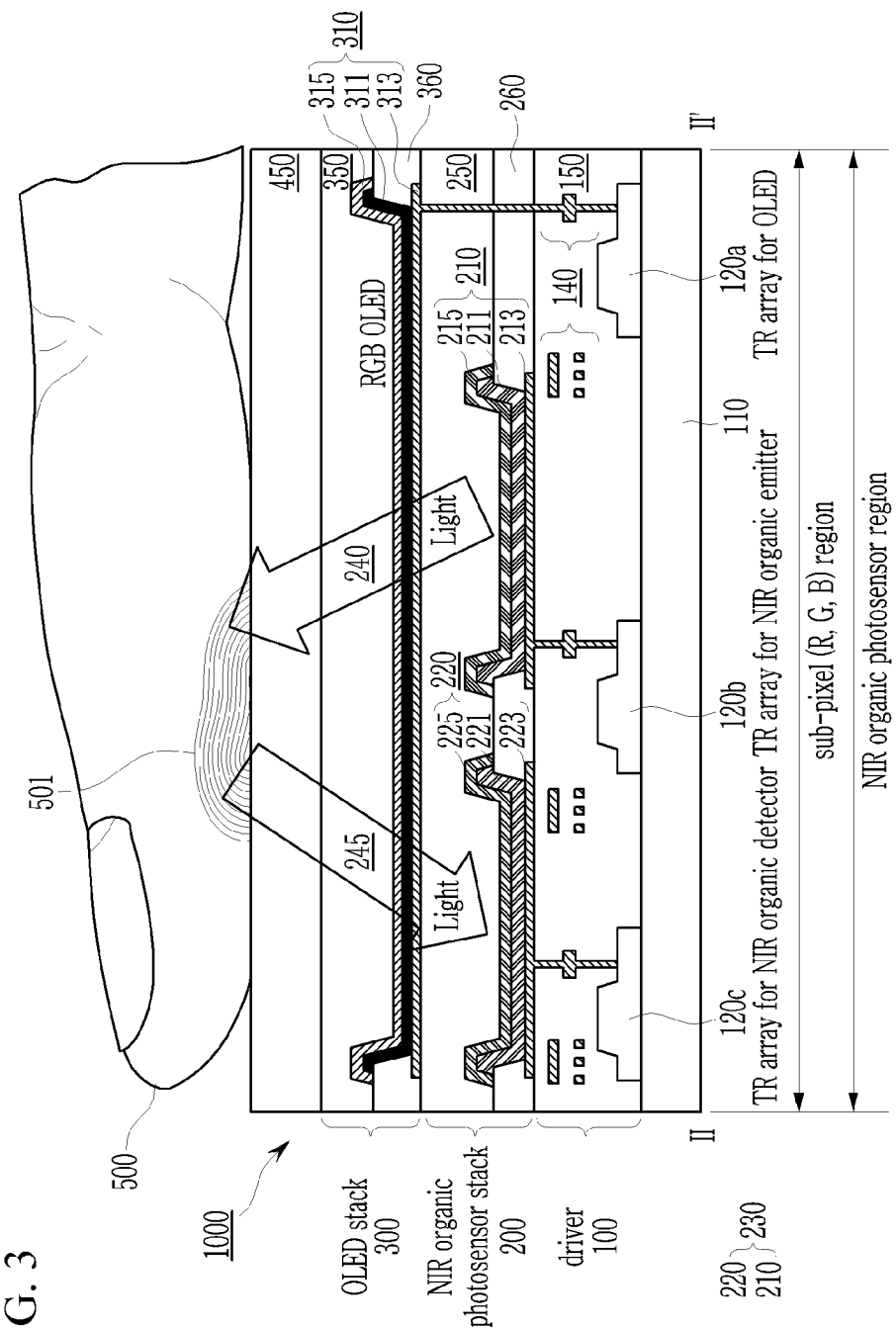
FIG. 3 is a cross-sectional view illustrating a fingerprint recognition process using an OLED panel embedded with an NIR organic photosensor according to some example embodiments.

FIG. 3 is a schematic view illustrating an operation of carrying out biometrics recognition, and specifically, fingerprint recognition, using the organic light emitting diode (OLED) panel embedded with a near-infrared organic photosensor according to some example embodiments.

Referring to FIG. 3, in response to a biometric subject, for example, a finger 500 being placed on (e.g., directly on and/or indirectly on) the cover glass 450 of the OLED panel 1000, a driving signal is applied to the OLED panel 1000 to turn on ("initialize") the diode of the NIR organic emitter 210. Accordingly, light 240 of a NIR wavelength in a range ("wavelength spectrum") from about 800 nanometers to about 1500 nanometers is emitted from the NIR organic emitter 210 and radiated into a fingerprint 501 of the finger 500. The light 240 of a NIR wavelength ("NIR light") is not a visible ray ("visible wavelength spectrum") and thus may not be caught ("observed") by human eyes. In response to an object like the finger 500 being located on the display surface including the cover glass 450, the light 240 of a NIR wavelength ("NIR light") may be reflected or scattered on the surface of the finger 500. The reflected or scattered NIR light 245 is light-received and detected by the NIR organic detector 220. Charges light-received by the NIR organic detector 220 are read by a transistor array 120c for an NIR organic detector and go through an image processor to be processed by the image processor to obtain a fingerprint image of the finger 500, through which a fingerprint recognition may be performed.

Although FIG. 3 exemplifies a fingerprint of a finger 500 as a biometric subject, the OLED panel 1000 may be applied for (e.g., configured to detect) various biometric subjects including a palm print, an iris, a retina, and a face.

As for an organic light emitting diode (OLED) panel embedded with the NIR organic photosensor illustrated with a reference to FIGS. 1 to 3, when the NIR organic photosensor 230 including the NIR organic emitter 210 and the NIR organic detector 220 is adopted, the NIR organic emitter 210 may be configured to selectively emit NIR light 230 alone and thus may not need a separate NIR color filter. In some example embodiments, the NIR organic emitter 210 emits NIR alone which is not recognized ("detected") by a user and thus may give less feeling of fatigue to the user. Furthermore, since NIR has a larger wavelength than visible light and thus small scattering refection, it is advantageous to be used to obtain depth information of an image. In some example embodiments, NIR light 230 may be selectively emitted to enable biometric recognition in order to enable performance of biometric recognition before ("prior to") display of the OLED stack 300. For example, the OLED panel 1000 may be configured to generate a display, via OLED stack 300, in response to performing biometric recognition of a subject (e.g., via biometric recognition performed regarding finger 500). Furthermore, the NIR organic emitter 210 may be used as a separate NIR light source to increase the degree of constitutional freedom. Accordingly, the NIR organic emitter 210 and NIR organic detector 220 (e.g., the NIR organic photosensor 230) may configure the OLED panel 1000 to implement biometric recognition of a subject without having effect on an aperture ratio of the OLED emitter 310.

FIGS. 4A-4D show a pixel array of the OLED panel 1000 embedded with an NIR organic photosensor 230 and various layouts of the NIR organic photosensor 230.

Figure 4A:
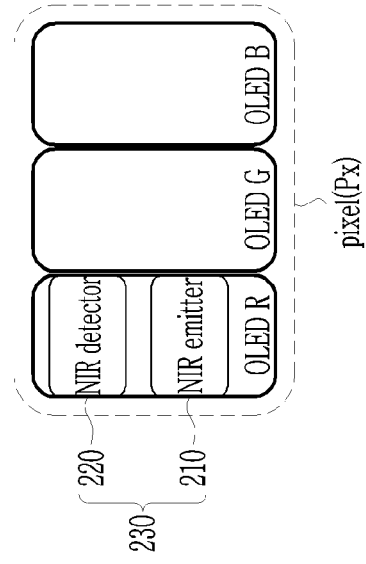
FIGS. 4A-4D are schematic views showing various pixel layouts of OLED panels embedded with an NIR organic photosensors according to some example embodiments.
Figure 4B:
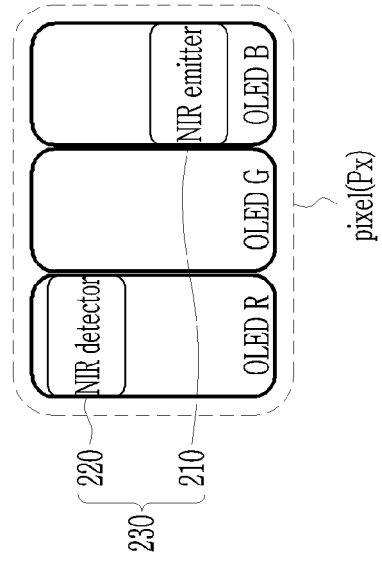

As shown in FIG. 4A, the NIR organic photosensor 230 may not be disposed in some sub-pixels (ex., OLED B), or as shown in FIG. 4B, the NIR organic photosensor 230 may be disposed in only one sub-pixel (ex., OLED R) of a pixel.

Figure 4C:
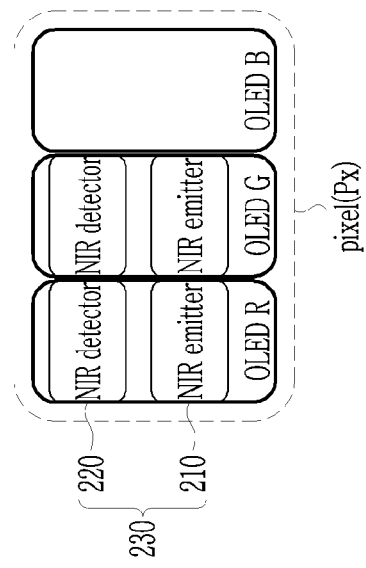
Figure 4D:
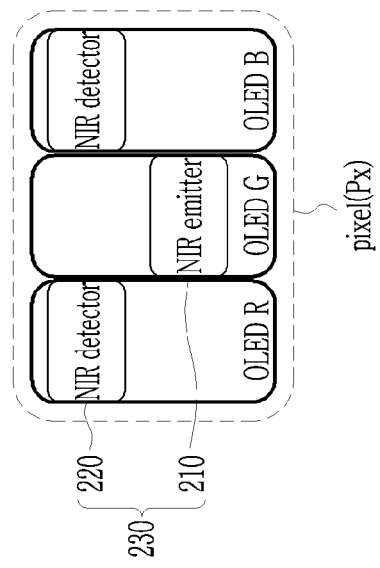

In some example embodiments, as shown in FIG. 4C, each of the NIR organic detector 220 and the NIR organic emitter 210 are disposed in a given pixel while being separated in adjacent sub-pixels of the given pixel. In some example embodiments, as shown in FIG. 4D, the NIR organic detector 220 and the NIR organic emitter 210 may be disposed in a given pixel while skipping every other sub-pixel of the given pixel in the adjacent sub-pixels of the given pixel.

As shown above, the various arrays of the various pixels and the NIR organic photosensor 230 may be modified according to the recognition area and the image shape of the biometric subject, such that certain configurations of the NIR organic photosensor 230 may be configured to provide a particular recognition area and/or to detect a particular image shape of a biometric subject.

Figure 5:
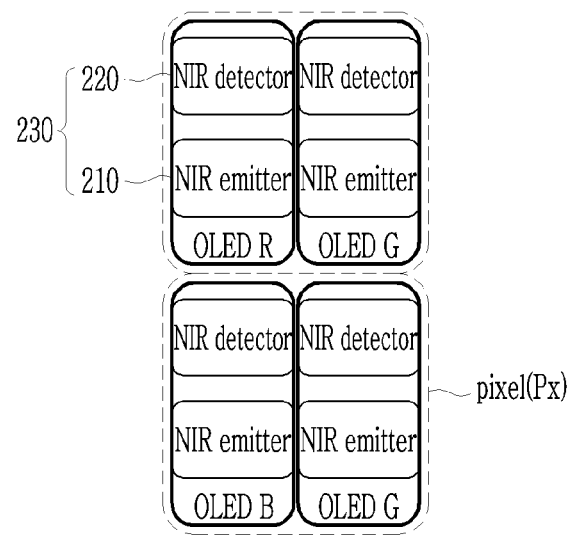
FIG. 5 is a schematic view showing a pixel layout of an OLED panel embedded with an NIR organic photosensor according to some example embodiments.

FIG. 5 is a schematic view of another pixel layout of OLED panel in which an NIR organic photosensor is embedded. FIG. 5 shows a pentile matrix type of layout in which one pixel (Px) includes an RGBG pattern. It exemplifies that the NIR organic photosensor 230 is disposed in every sub-pixel (R, G, B, G), but it may be modified to have the various shapes as in FIG. 4.

Figure 6A:
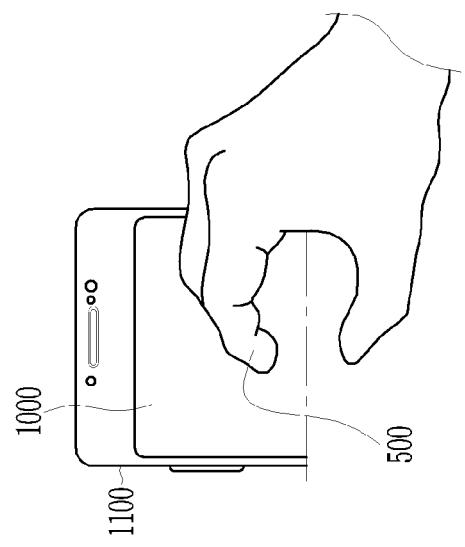
FIGS. 6A-6C are schematic views showing a layout of a pixel array part of a OLED panel embedded with an NIR organic photosensor according to some example embodiments.
Figure 6B:
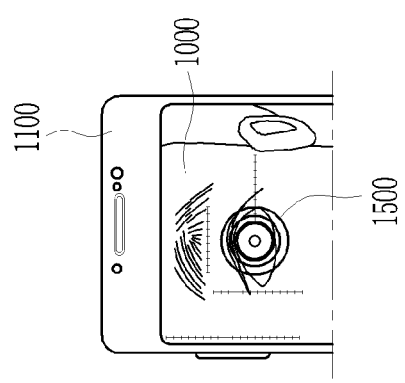
Figure 6C:
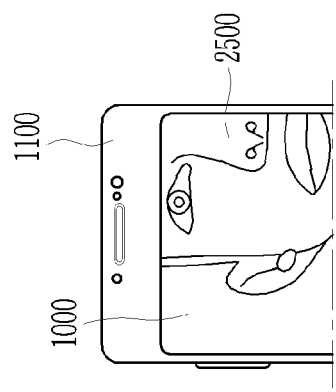

FIGS. 6A-6C are schematic view of smart phones 1100 including OLED panels 1000 embedded with NIR organic photosensors 230 according to embodiments.

FIG. 6A shows that the OLED panel 1000 that is embedded with an NIR organic photosensor (e.g., photosensor 230) may recognize a fingerprint 501, FIG. 6B shows the case of recognizing an iris 1500, and FIG. 6C shows the case of recognizing a face 2500.

FIGS. 6A-6C show a smart phone 1100 as one example of the display device, but the OLED panel 1000 that includes an embedded NIR organic photosensor 230 may be applied to ("included in") a screen including a TV as well as for a multi-media player, a tablet PC, or the like that are capable of employing the OLED panel 1000 embedded with an NIR organic photosensor 230, in addition to the smart phone 1100.

Figure 7:
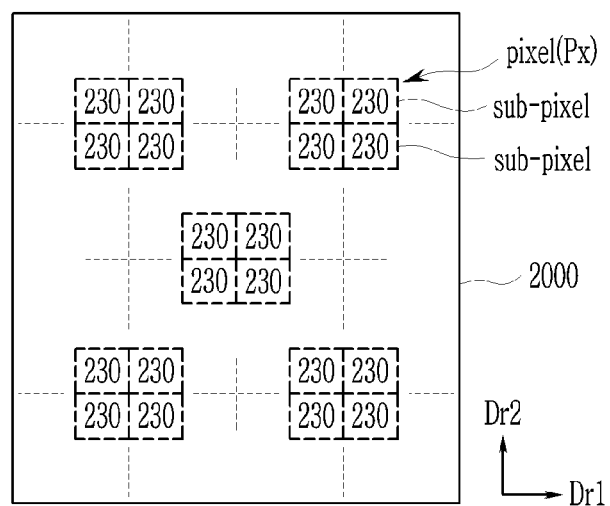
FIG. 7 shows schematic views showing mobile display devices including OLED panels embedded with NIR organic photosensors according to embodiments.

FIG. 7 shows that the NIR organic photosensor 230 is limitedly disposed in a particular (or, alternatively, predetermined) pixel (Px) of a pixel array part of OLED panel 2000. The productivity may be enhanced by forming the NIR organic photosensor 230 only in a particular (or, alternatively, predetermined) desired pixel (Px) according to the recognition range of the biometric subject and by decreasing an amount of an NIR light-emitting (fluorescence or phosphorescence) material or an NIR light-absorbing material. In FIG. 7, Dr1 and Dr2 denote a row direction and a column direction, respectively, when a plurality of pixels (Px) are arranged in a matrix.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims.

Figure 8:
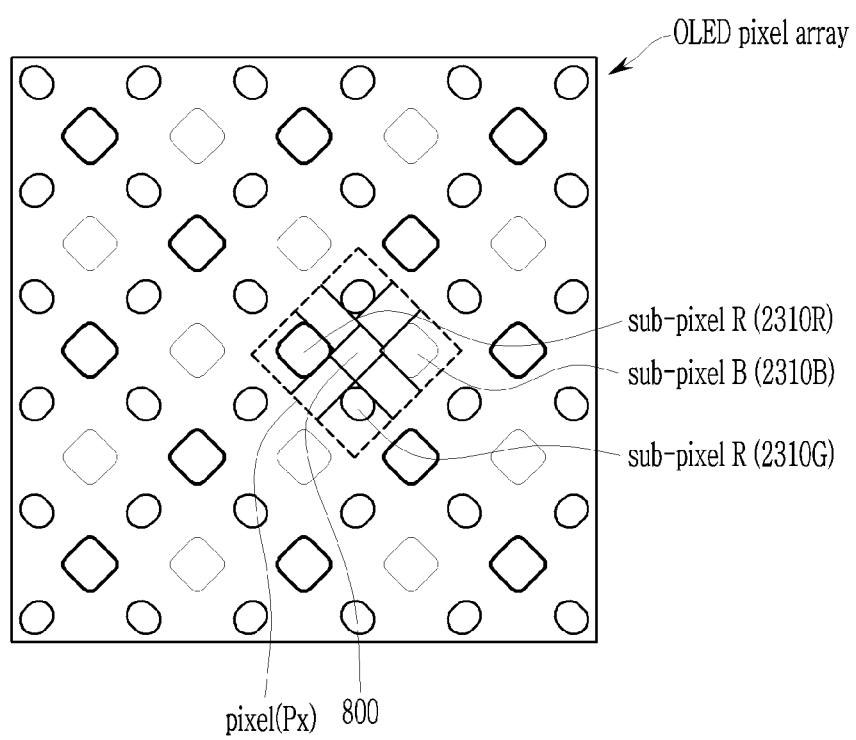
FIG. 8 is a schematic view showing a pixel layout of an organic light emitting diode (OLED) panel embedded with a near infrared (NIR) organic photosensor according to an some example embodiments.
Figure 9:
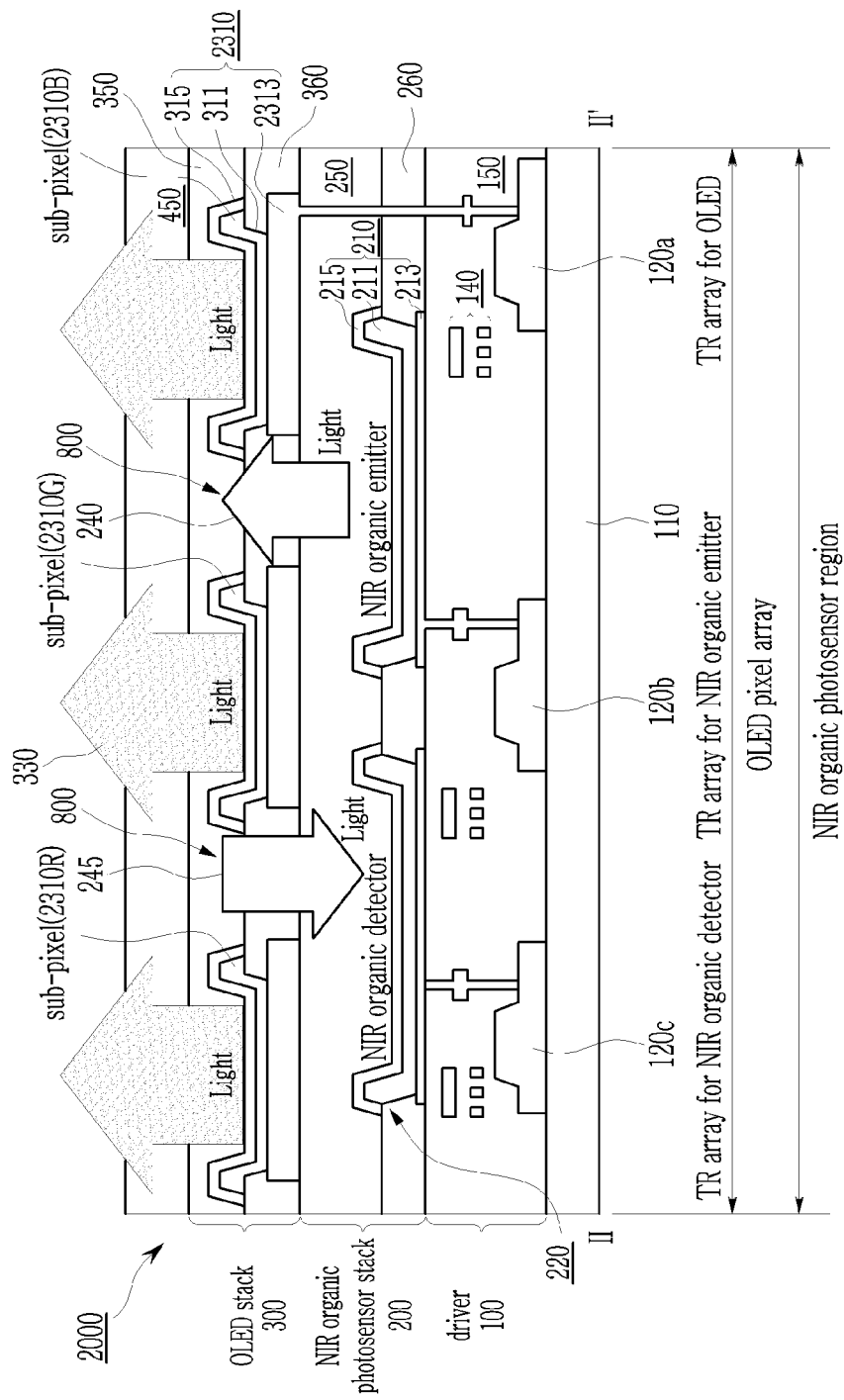
FIG. 9 is a cross-sectional view showing an OLED panel embedded with an NIR organic photosensor according to an some example embodiments.

FIG. 8 and FIG. 9 show a pixel layout of an OLED panel 2000 embedded with a near-infrared organic photosensor according to some example embodiments and a cross-sectional view thereof, respectively.

As shown in FIGS. 8 and 9, the NIR organic emitter 210 and the NIR organic detector 220 may be on a non-light-emitting portion 800 of the pixel Px, where the non-lightemitting portion 800 is between at least two proximate sub-pixels of the pixel Px, and NIR light from NIR organic photosensor stack 200 is emitted and entered through a non-light-emitting portion 800 of a pixel Px, between at least two proximate sub-pixels 2310R, 2310G, and 2310B at least partially comprising the pixel Px, in an OLED panel 2000 in which a NIR organic photosensor is embedded according to some example embodiments.

Accordingly, organic light emitting diode 2310 constituting the sub-pixels 2310R, 2310G, and 2310B may be formed in a structure capable of strong resonance. Specifically, as shown in FIG. 9, the red sub-pixel 2310R, the green sub-pixel 2310G, and the blue sub-pixel 2310B are formed of the organic light emitting diode 2310. The organic light emitting diode (OLED) 2310 includes an organic emission layer 311 for emitting light of a corresponding wavelength and a first electrode 2313 and a second electrode 315 formed on and under the organic mission layer 311. Either one of the first electrode 313 and the second electrode 315 is connected with a driving voltage line (Vdd) and an output terminal (Out Put) to function as an anode, and the other one is connected with a common voltage (Vss) to function as a cathode. The second electrode 315 may be formed as a transparent electrode having a thickness of 10 nm or less in order to display light emitted from the organic emission layer 311 outside. For example, the second electrode 315 may be formed of MgAg, Ag, Al, Mo, Ti, TiN, Ni, ITO, IZO, AIZO, AITO, or the like. The first electrode 2313 may be formed as ("may include") a reflective electrode because the first electrode 2313 is independent of light exit from and enter to the NIR organic photosensor stack 200. By forming the first electrode 2313 as a reflective electrode, the luminous efficiency of the organic light emitting diode 2310 can be further improved. For example, the first electrode 2313 may be made of Al, Ag. Mo, AlNd, Mo/Al/Mo, TiN, ITO/Ag/ITO, ITO/Al/ITO and ITO/Mo/ITO.

The NIR organic emitter 210 and the NIR organic detector 220 constituting the NIR organic photosensor stack 200 may be larger, the same or smaller than the organic light emitting diode 2310, respectively. The NIR organic emitter 210 and the NIR organic detector 220 may be disposed under the non-light-emitting portion 800 between the organic light emitting diode 2310 constituting the sub-pixels 2310R, 2310G, and 2310B to allow NIR light to exit from and enter to the NIR organic photosensor stack 200 through the non-light-emitting portion 800 at least partially defined by the lower insulation layer 360 between the organic light emitting diode 2310. Accordingly, the NIR organic emitter 210 and NIR organic detector 220 (e.g., the NIR organic photosensor 230) may configure the OLED panel 1000 to implement biometric recognition of a subject without having effect on an aperture ratio of the OLED emitter 310. Other remaining components are the same as those of the example embodiments described with reference to FIG. 2, and therefore, description thereof will be omitted.

Figure 10:
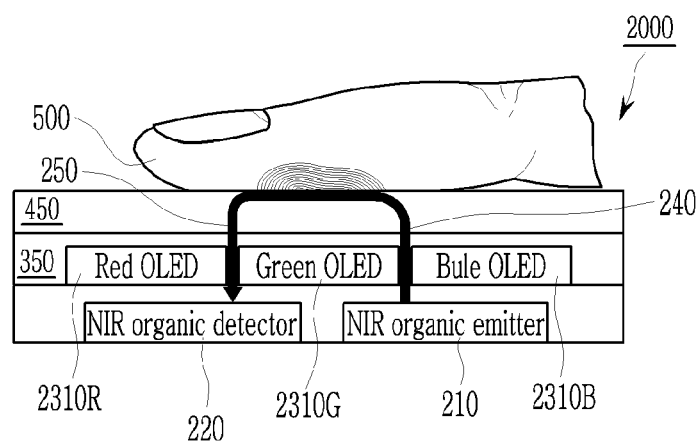
FIG. 10 is a flowchart illustrating a biometric recognition algorithm in an OLED panel embedded with an NIR organic photosensor.

FIG. 10 is a schematic view illustrating an operation of carrying out biometrics recognition, and specifically, fingerprint recognition, using the organic light emitting diode (OLED) panel embedded with a near-infrared organic photosensor according to some example embodiments.

On the cover glass 450 of the OLED panel 1000, when a biometric subject, for example, a finger 500 is put, a driving signal is applied thereto to turn on the diode of the NIR organic emitter 210. Accordingly, light 240 of a NIR wavelength in a range from about 800 to about 1500 is emitted from the NIR organic emitter 210 and radiated into a fingerprint of the finger 500 through the non-light-emitting portion 800 between the organic light emitting diode 2310 constituting the sub-pixels 2310R, 2310G. The light 240 of a NIR wavelength is not a visible ray and thus may not be caught by human eyes. When an object like the finger 500 is put on the display surface formed of the cover glass 450, the light 240 of a NIR wavelength may be reflected or scattered on the surface of the finger 500. The reflected or scattered NIR light 245 is received and detected by the NIR organic detector 220 through the non-light-emitting portion 800 at least partially defined by the lower insulation layer 360 between the organic light emitting diode 2310 constituting the sub-pixels 2310R, 2310G. Accordingly, the NIR organic emitter 210 and NIR organic detector 220 (e.g., the NIR organic photosensor 230) may configure the OLED panel 1000 to implement biometric recognition of a subject without having effect on an aperture ratio of the OLED emitter 310.

Figure 11:
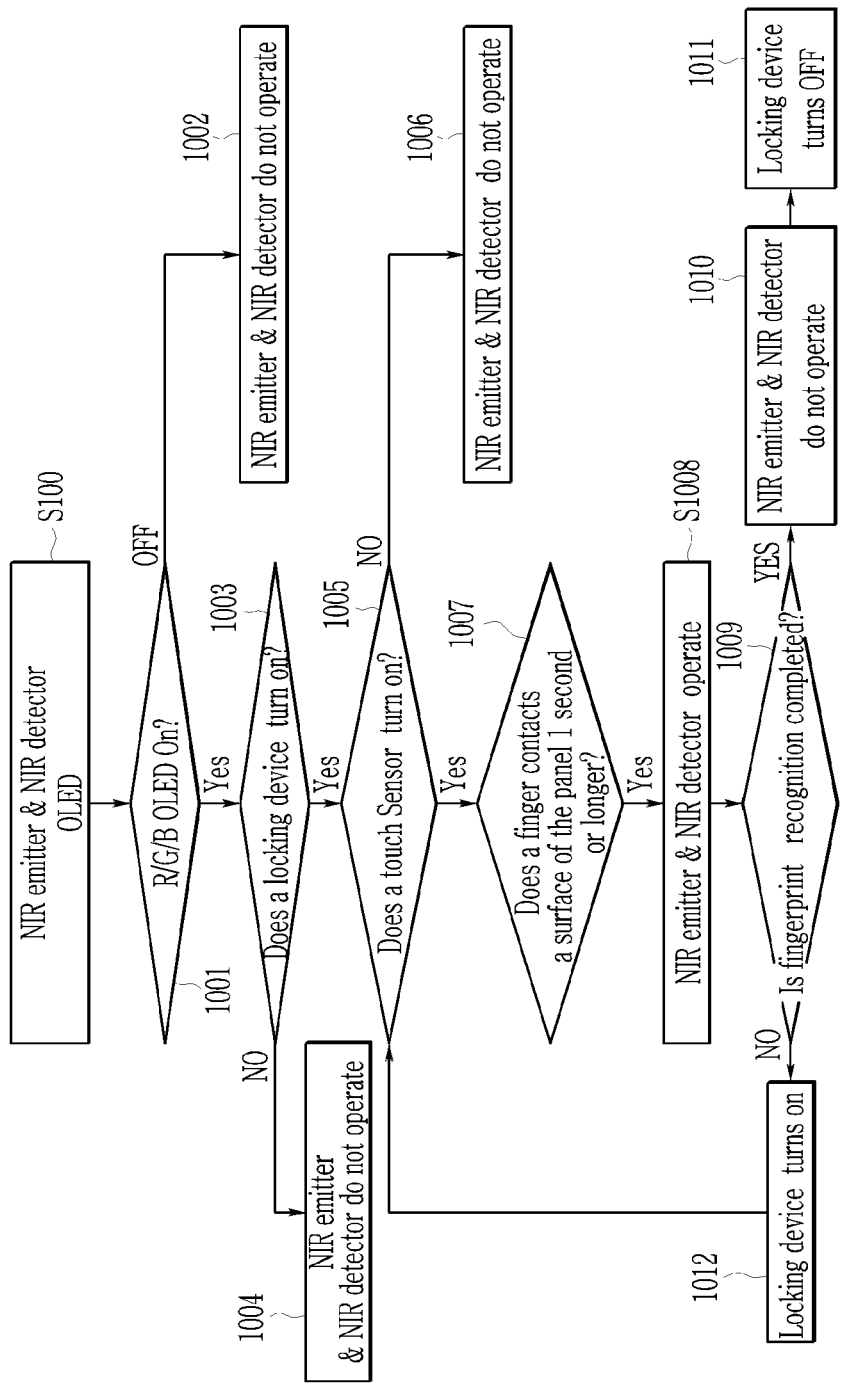
FIG. 11 shows an operation algorithm of an OLED panel or in which an NIR organic emitter and an NIR organic detector are embedded.

FIG. 11 shows an operation algorithm of the OLED panel 1000 or 2000 in which the NIR organic emitter 210 and the NIR organic detector 220 are embedded.

First, it is determines whether an R/G/B OLED is turned on (1001). An R/G/B OLED being on means a state of shifting to a display mode after switching a start power on. The NIR organic emitter 210 and the NIR organic detector 220 are not operated when an R/G/B OLED is turned off (1002). When an R/G/B OLED is turned on, it is determined whether a locking device turns on (1003). When the locking device is turned off, the NIR organic emitter 210 and the NIR organic detector 220 are not operated since it is also one means of locking device (1004). When the locking device turns on, it is determined whether touch sensors turn on (1005). When the touch sensor is turned off, the NIR organic emitter 210 and the NIR organic detector 220 do not operate (1006). This is to prevent a power consumption loss of more than that required by blocking touch in a waiting mode. When the touch sensor turns on even in a locking mode, it is determined whether a finger contacts the surface of the panel for a particular (or, alternatively, predetermined) time or longer (e.g., 1 second or longer) (1007), and the NIR organic emitter 210 and the NIR organic detector 220 are operated when being contacted for the particular (or, alternatively, predetermined) time or longer (1008). It is determined whether a fingerprint recognition is completed (1009), and when the fingerprint recognition is completed, the NIR organic emitter 210 and the NIR organic detector 220 do not operate (1010) and the locking device is turned off (1011). When the fingerprint recognition is not completed, the locking device turns on again (1012), and the procedure goes to step 1005 again and operates.

Figure 12:
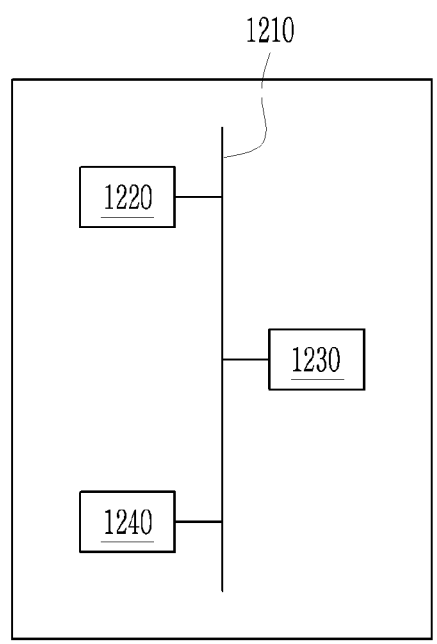
FIG. 12 is a schematic diagram of an electronic device according to some example embodiments.

FIG. 12 is a schematic diagram of an electronic device 1200 according to some example embodiments.

As shown in FIG. 12, an electronic device 1200 may include a processor 1220, a memory 1230, and display device 1240 that are electrically coupled together via a bus 1210. The display device 1140 may be display device of any of the example embodiments as described herein, and thus may include any of the example embodiments of OLED panels as described herein. The memory 1230, which may be a non-transitory computer readable medium, may store a program of instructions. The processor 1220 may execute the stored program of instructions to perform one or more functions, including implementing the biometric recognition of an individual based on processing electrical signals received from the NIR light sensor as described herein (e.g., to detect a fingerprint, an iris, or face image). The processor 1120 may be configured to generate an output (e.g., an image to be displayed on the display device, a command to operate 100: driver
120a: TR array for an OLED
120b: TR array for NIR organic emitter
120c: TR array for NIR organic detector
200: NIR organic photosensor stack
210: NIR organic emitter
220: NIR organic detector
300: OLED stack
310: OLED emitter

What is claimed is:

1. An Organic Light Emitting Diode (OLED) panel embedded with a Near Infrared (NIR) light sensor, the OLED panel comprising:
 a plurality of OLED pixels, the plurality of OLED pixels including
  a substrate;
  an OLED stack on the substrate, the OLED stack configured to emit visible light in a first direction; and
  an NIR light sensor stack between the substrate and the OLED stack, the NIR light sensor stack including
   an NIR emitter configured to emit NIR light through the OLED stack in the first direction, and
   an NIR detector configured to receive NIR light through the OLED stack,
  wherein both the NIR emitter and the NIR detector are in one or more sub-pixels of an OLED pixel of the plurality of OLED pixels, while neither of any NIR emitter or any NIR detector are in one or more other sub-pixels of the OLED pixel of the plurality of OLED pixels.

2. The OLED panel embedded with the NIR light sensor of claim 1, wherein the OLED stack is configured to emit light away from the NIR light sensor stack.

3. The OLED panel embedded with the NIR light sensor of claim 2, wherein an OLED emitter of the OLED stack includes
 an organic light emitting diode (OLED) including an organic emission layer and a plurality of electrodes on opposite surfaces of the organic emission layer, such that a first electrode of the plurality of electrodes is under the organic emission layer and a second electrode of the plurality of electrodes is over the organic emission layer, and
 the second electrode includes a transparent electrode.

4. The OLED panel embedded with the NIR light sensor of claim 3, wherein
 the first electrode includes a separate transparent electrode.

5. The OLED panel embedded with the NIR light sensor of claim 1, further comprising:
 a driver between the substrate and the NIR light sensor stack, the driver configured to input and output electrical signals of each of the NIR light sensor stack and the OLED stack.

6. The OLED panel embedded with the NIR light sensor of claim 1, wherein a driver configured to input and output an electrical signal from the NIR light sensor stack and a driver configured to input and output an electrical signal from the OLED stack are on a substantially common plane.

7. The OLED panel embedded with the NIR light sensor of claim 1, wherein the NIR emitter is an NIR organic photodiode that is configured to emit NIR light of a wavelength spectrum of about 800 nm to about 1500 nm.

8. The OLED panel embedded with the NIR light sensor of claim 7, wherein
 the NIR organic photodiode includes an organic emission layer configured to emit the NIR light and lower and upper electrodes on opposite surfaces of the organic emission layer, respectively, and
 the upper electrode is a transparent electrode and the lower electrode is a reflective electrode.

9. The OLED panel embedded with the NIR light sensor of claim 1, wherein the NIR detector is an NIR organic photodiode that is configured to absorb NIR light of a wavelength spectrum of about 800 nm to about 1500 nm.

10. The OLED panel embedded with the NIR light sensor of claim 9, wherein the NIR organic photodiode includes
 an organic light-absorbing layer configured to absorb the NIR light and lower and upper electrodes on opposite surfaces of the organic light-absorbing layer, respectively,
 wherein the upper electrode is a transparent electrode having a transmittance equal to or greater than about 80%, and the lower electrode is a reflective electrode.

11. The OLED panel embedded with the NIR light sensor of claim 1, wherein the NIR light sensor stack is configured to detect a fingerprint, an iris, or a face image.

12. A display device comprising the OLED panel embedded with the NIR light sensor of claim 11.

13. An Organic Light Emitting Diode (OLED) panel, comprising:
 a plurality of OLED pixels, the plurality of OLED pixels including
  a substrate;
  an OLED stack on the substrate, the OLED stack configured to emit visible light in a first direction; and
  an NIR light sensor stack between the substrate and the OLED stack, the NIR light sensor stack including
   an NIR emitter configured to emit NIR light in the first direction through the OLED stack, and
   an NIR detector configured to receive NIR light through the OLED stack,
  wherein both the NIR emitter and the NIR detector are in one or more sub-pixels of an OLED pixel of the plurality of OLED pixels, while neither of any NIR emitter or any NIR detector are in one or more other sub-pixels of the OLED pixel of the plurality of OLED pixels.

14. The OLED panel of claim 13, further comprising:
 a driver between the substrate and the NIR light sensor stack, the driver configured to input and output electrical signals of each of the NIR light sensor stack and the OLED stack.

15. The OLED panel of claim 13, wherein a driver configured to input and output an electrical signal from the NIR light sensor stack and a driver configured to input and output an electrical signal from the OLED stack are on a substantially common plane.

16. The OLED of claim 13, wherein the NIR emitter is an NIR organic photodiode that is configured to emit NIR light of a wavelength spectrum of about 800 nm to about 1500 nm.

17. The OLED panel of claim 16, wherein
 the NIR organic photodiode includes an organic emission layer configured to emit the NIR light and lower and upper electrodes on opposite surfaces of the organic emission layer, respectively, and
 the upper electrode is a transparent electrode and the lower electrode is a reflective electrode.

18. The OLED panel of claim 13, wherein the NIR detector is an NIR organic photodiode that is configured to absorb NIR light of a wavelength spectrum of about 800 nm to about 1500 nm.

19. The OLED panel of claim 18, wherein the NIR organic photodiode includes
an organic light-absorbing layer configured to absorb the NIR light and lower and upper electrodes on opposite surfaces of the organic light-absorbing layer, respectively,
wherein the upper electrode is a transparent electrode having a transmittance equal to or greater than about 80%, and the lower electrode is a reflective electrode.

20. An electronic device, comprising:
a memory;
a processor; and
a display device including an Organic Light Emitting Diode (OLED) panel, the OLED panel including a plurality of OLED pixels, the plurality of OLED pixels including
a substrate;
an OLED stack on the substrate, the OLED stack configured to emit visible light in a first direction; and
an NIR light sensor stack between the substrate and the OLED stack, the NIR light sensor stack including
an NIR emitter configured to emit NIR light in the first direction through the OLED stack, and
an NIR detector configured to receive NIR light through the OLED stack,
wherein both the NIR emitter and the NIR detector are in one or more sub-pixels of an OLED pixel of the plurality of OLED pixels, while neither of any NIR emitter or any NIR detector are in one or more other sub-pixels of the OLED pixel of the plurality of OLED pixels.

21. The electronic device of claim 20, wherein the processor is configured to execute a program of instructions stored in the memory to implement biometric recognition of an individual based on processing electrical signals received from the NIR light sensor to detect a fingerprint, an iris, or a face image.

22. The electronic device of claim 20, wherein the OLED panel further includes
a driver between the substrate and the NIR light sensor stack, the driver configured to input and output electrical signals of each of the NIR light sensor stack and the OLED stack.

23. The electronic device of claim 20, wherein a driver configured to input and output an electrical signal from the NIR light sensor stack and a driver configured to input and output an electrical signal from the OLED stack are on a substantially common plane.

24. The electronic device of claim 20, wherein the NIR emitter is an NIR organic photodiode that is configured to emit NIR light of a wavelength spectrum of about 800 nm to about 1500 nm.

25. The electronic device of claim 24, wherein
the NIR organic photodiode includes an organic emission layer configured to emit the NIR light and lower and upper electrodes on opposite surfaces of the organic emission layer, respectively, and
the upper electrode is a transparent electrode and the lower electrode is a reflective electrode.

26. The electronic device of claim 20, wherein the NIR detector is an NIR organic photodiode that is configured to absorb NIR light of a wavelength spectrum of about 800 nm to about 1500 nm.

27. The electronic device of claim 26, wherein the NIR organic photodiode includes
an organic light-absorbing layer configured to absorb the NIR light and lower and upper electrodes on opposite surfaces of the organic light-absorbing layer, respectively,
wherein the upper electrode is a transparent electrode having a transmittance equal to or greater than about 80%, and the lower electrode is a reflective electrode.

* * * * *